(12) United States Patent
Baquiano et al.

(10) Patent No.: US 8,937,807 B2
(45) Date of Patent: Jan. 20, 2015

(54) CIRCUIT BOARD HEATSINK AND HEATFRAME STRUCTURES WITH HEATER ELEMENT FOR CIRCUIT BOARD OPERATION AT BELOW ZERO TEMPERATURE

(75) Inventors: Carmelo Engracia Baquiano, Dela Paz Pasig (PH); Carmelo Delovino Cayaban, Cainta Rizal (PH); Paul Francis Brosas Montalbo, Liliw Laguna (PH); Joseph Estorgio Celocia, Marilag Quezon (PH)

(73) Assignee: Emerson Network Power—Embedded Computing, Inc., Tempe, AZ (US)

( * ) Notice: Subject to any disclaimer, the term of this patent is extended or adjusted under 35 U.S.C. 154(b) by 490 days.

(21) Appl. No.: 13/300,871

(22) Filed: Nov. 21, 2011

(65) Prior Publication Data

US 2013/0128452 A1   May 23, 2013

(51) Int. Cl.
*H05K 7/20* (2006.01)
*G05D 23/19* (2006.01)
*H05K 1/18* (2006.01)

(52) U.S. Cl.
CPC .................. *G05D 23/19* (2013.01); *H05K 1/18* (2013.01); *H05K 7/20* (2013.01); *H05K 7/20536* (2013.01)
USPC ...... 361/679.54; 361/717; 361/720; 174/252; 374/178; 62/3.3

(58) Field of Classification Search
USPC ........................ 361/676–678, 679.46–679.54, 361/688–722, 752, 760–761, 831
See application file for complete search history.

(56) References Cited

U.S. PATENT DOCUMENTS

| | | | |
|---|---|---|---|
| 4,847,471 A | 7/1989 | Wallgren et al. | |
| 4,855,572 A | 8/1989 | Wallgren et al. | |
| 4,935,864 A * | 6/1990 | Schmidt et al. | 363/141 |
| 6,196,002 B1 * | 3/2001 | Newman et al. | 62/3.7 |
| 6,363,217 B1 | 3/2002 | Walz et al. | |
| 6,489,793 B2 | 12/2002 | Jones et al. | |
| 6,788,084 B2 | 9/2004 | Jones et al. | |
| 6,839,235 B2 | 1/2005 | St. Louis et al. | |
| 7,218,129 B2 | 5/2007 | Beaman et al. | |
| 7,256,610 B1 | 8/2007 | Balasubramanian et al. | |
| 7,347,621 B2 | 3/2008 | Sri-Jayantha et al. | |

(Continued)

OTHER PUBLICATIONS

Joe Eicher, "New Ruggedization Enables Commercial-Grade Products in Harsh Environments", VME and Critical Systems, Feb. 2009, pp. 45-47.

(Continued)

*Primary Examiner* — Courtney Smith
(74) *Attorney, Agent, or Firm* — Harness, Dickey & Pierce, P.L.C.

(57) ABSTRACT

A circuit board assembly including a heating device operated during cold boot startup includes a circuit board having a computer component. A thermal transfer device connected to the circuit board assembly acts when the computer component is operating to remove heat generated by the computer component. A heating device operates to heat the thermal transfer device. A field programmable gate array acts to energize the heating device when a temperature defining a cold startup condition at the computer component or the thermal transfer device is sensed. The thermal transfer device when heated by the heating device heats the computer component to greater than the temperature of the cold startup condition. A control device connected to the heating device provides an operational mode of the heating device.

10 Claims, 10 Drawing Sheets

(56) References Cited

U.S. PATENT DOCUMENTS

| | | | |
|---|---|---|---|
| 7,446,560 B2 | 11/2008 | Balasubramanian et al. | |
| 7,560,954 B2 * | 7/2009 | Balasubramanian et al. | 326/38 |
| 7,613,002 B2 * | 11/2009 | Ye et al. | 361/708 |
| 7,695,188 B2 | 4/2010 | Sri-Jayantha et al. | |
| 7,701,238 B2 | 4/2010 | Wong et al. | |
| 7,748,895 B2 | 7/2010 | Sri-Jayantha et al. | |
| 7,758,240 B2 | 7/2010 | J lio et al. | |
| 7,855,397 B2 * | 12/2010 | Alley et al. | 257/99 |
| 8,462,499 B2 * | 6/2013 | Nishioka et al. | 361/688 |
| 8,552,283 B2 * | 10/2013 | Dede et al. | 136/205 |
| 8,649,179 B2 * | 2/2014 | Hershberger et al. | 361/712 |
| 2003/0184941 A1 * | 10/2003 | Maeda et al. | 361/103 |
| 2005/0052847 A1 * | 3/2005 | Hamman | 361/699 |
| 2006/0109631 A1 * | 5/2006 | Marro et al. | 361/718 |
| 2007/0029629 A1 * | 2/2007 | Yazdi | 257/414 |
| 2011/0141692 A1 | 6/2011 | Bult | |
| 2014/0016426 A1 * | 1/2014 | Hyde et al. | 365/228 |

OTHER PUBLICATIONS

Serge Tissot, "Conduction Cooling Techniques for Rugged Computers", Kontron Whitepaper, pp. 1-5, Kontron Modular Computers S.A.S, 2009.

* cited by examiner

CIRCUIT BOARD HEATSINK AND HEATFRAME STRUCTURES WITH HEATER ELEMENT FOR CIRCUIT BOARD OPERATION AT BELOW ZERO TEMPERATURE

FIELD

The present disclosure relates to circuit board assemblies and to devices for pre-heating circuit board assemblies for cold boot startup condition and extended operation at below zero ambient temperatures.

BACKGROUND

This section provides background information related to the present disclosure which is not necessarily prior art.

Computer systems having conduction cooled and/or convection cooled printed circuit assemblies, blades, and/or single board computers in many instances have cold boot startup limitations at below zero ° C. ambient temperatures. Many commercially available processors are designed for above zero (° C.) temperature startup. These devices also commonly include heatsink and/or heatframe structures which normally are used to remove and dissipate heat generated by the operating components. During startup, particularly at below zero (° C.) temperatures, the heat transfer properties of the heatsink and/or heatframe structures will further inhibit cold boot startup as they convectively or conductively draw away the heat energy needed by the system for central processing unit (CPU) startup.

SUMMARY

This section provides a general summary of the disclosure, and is not a comprehensive disclosure of its full scope or all of its features.

According to several embodiments, a circuit board assembly including a heating device operated during a cold startup condition includes a printed circuit board. A central processing unit (CPU) is mounted to the printed circuit board. A thermal transfer device is connected to the printed circuit board acting when the CPU is operating to remove heat generated by the CPU. A heating device operates to heat the thermal transfer device. The heating device is energized when a temperature defining a cold startup condition of the CPU or the thermal transfer device is sensed. The heating device induces heat energy input into the thermal transfer device to heat the thermal transfer device and the CPU to above the temperature of the cold startup condition.

According to other embodiments, a circuit board assembly including a heating device operated during cold boot startup includes a circuit board having a computer component. A thermal transfer device connected to the circuit board acts when the computer component is operating to remove heat generated by the computer component. A heating device operates to heat the thermal transfer device. A field programmable gate array energizes the heating device when a temperature defining a cold startup condition at the computer component or the thermal transfer device is sensed, to heat the thermal transfer device and thereby the computer component to greater than the temperature of the cold startup condition. A control device connected to the heating device provides an operational mode of the heating device.

According to further embodiments, a method is provided for transferring heat to and from components of a circuit board assembly including a central processing unit (CPU), a printed circuit board, a thermal transfer device and a heating device operated during a cold startup condition. The method includes positioning the thermal transfer device in contact with the printed circuit board; and energizing the heating device when a CPU temperature equals a temperature defining a cold startup condition to heat the thermal transfer device, the thermal transfer device thereafter heating the CPU.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
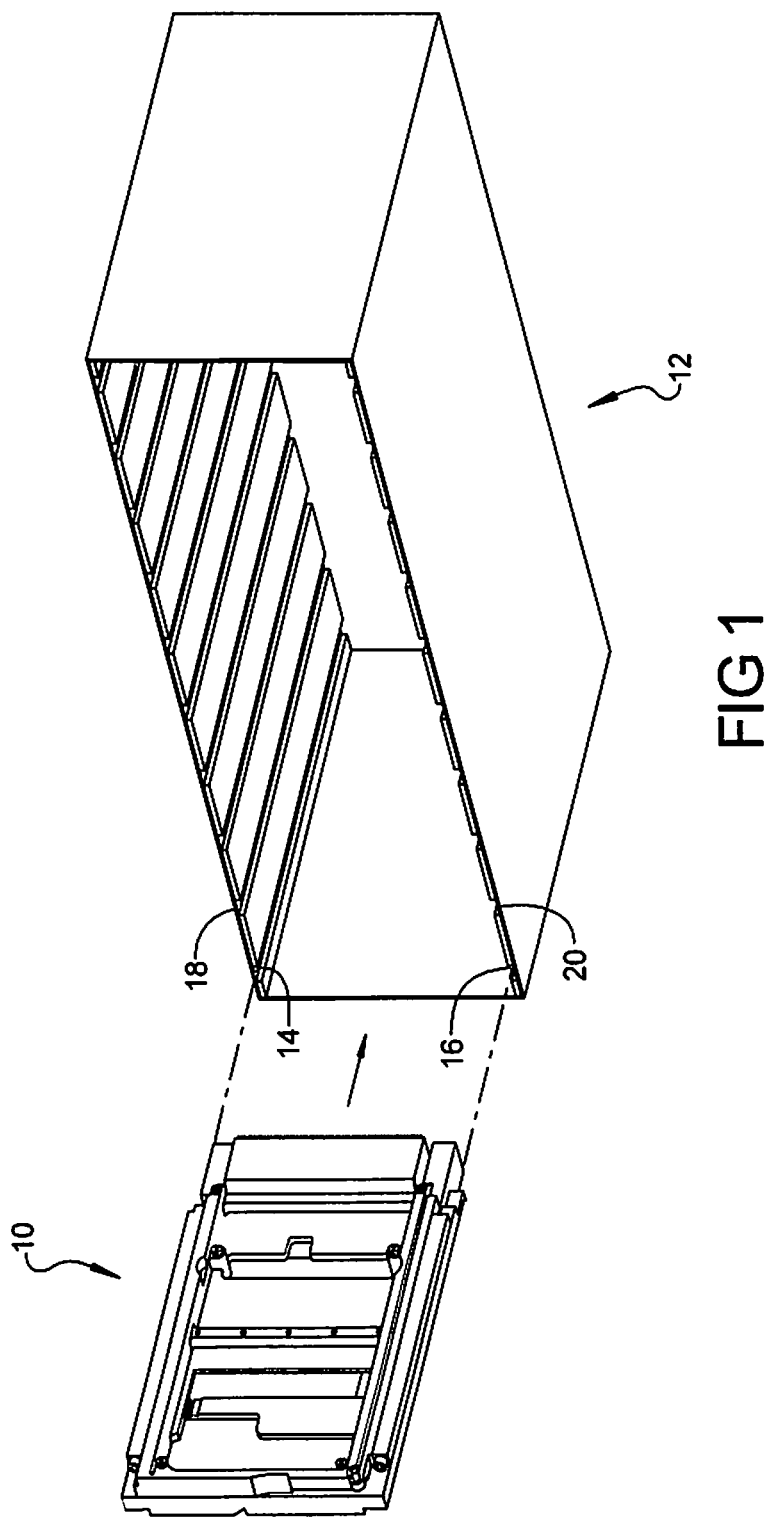
FIG. 1 is a left front perspective view of an exemplary cabinet for housing a circuit board assembly of the present enclosure.

Referring to FIG. 1, a circuit board assembly 10 can be adapted for sliding insertion into a housing such as a cabinet 12. Circuit board assembly 10 is slidably received within first and second board slots 14, 16 created in each of a cabinet first wall 18 and a cabinet second wall 20. Cabinet 12 can include a single set of first and second board slots 14, 16 to receive a single circuit board assembly or multiple sets of first and second board slots 14, 16 to receive multiple circuit board assemblies. Cabinet 12 can be used as a housing for a communication device such as a radio set or a computer station that can be exposed to atmospheric temperature conditions. Cabinet 12 and the components therein can therefore be exposed to ambient temperatures which may range from approximately −45° C. to approximately 35° C.

Figure 2:
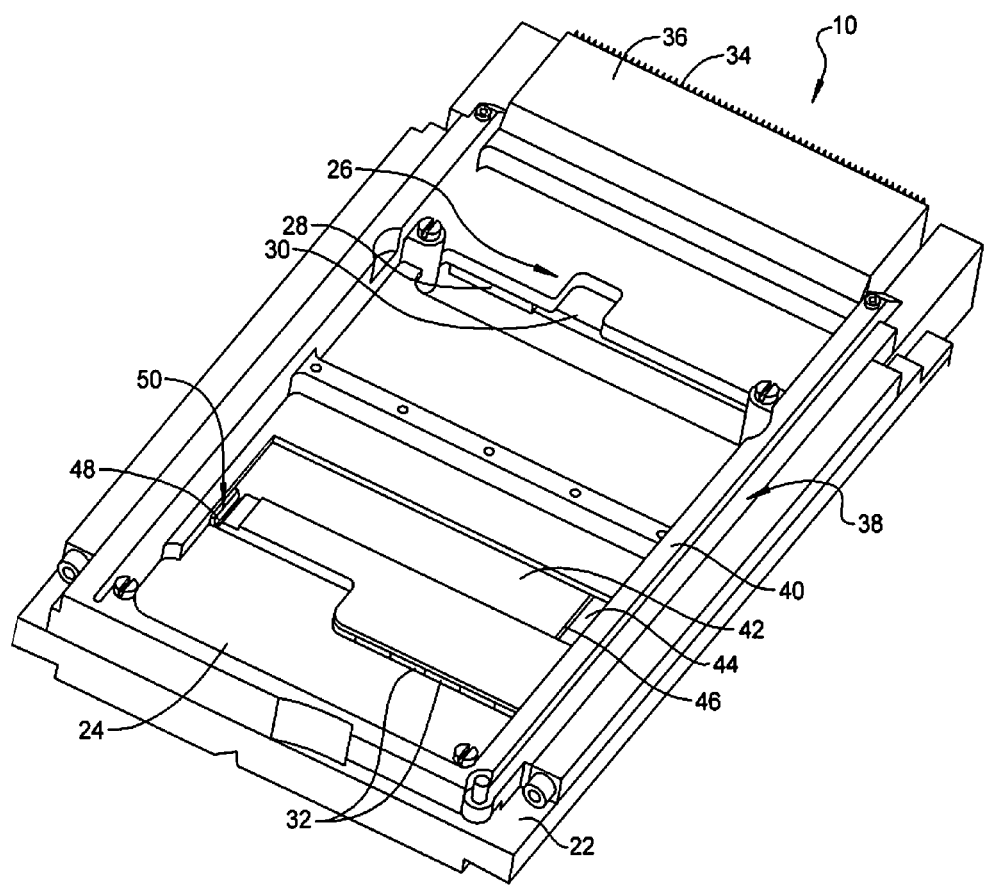
FIG. 2 is a top left perspective view of a conductively heated/cooled circuit board assembly of the present enclosure.

Referring to FIG. 2, circuit board assembly 10 can include a mounting plate/cover 22 having a circuit board such as a printed circuit board 24 connected to the mounting plate/ cover 22. One or more computer components 26 are connected to printed circuit board 24, which can include items such as a central processing unit (CPU) 28, a DIP switch 30, multiple memory devices 32, and other components such as a MOSFET, a power circuit, and/or a field programmable gate array (FPGA), which are shown in greater detail in reference to FIGS. 4-5. During operation, the heat generated by CPU 28 can in part be convectively dissipated for example by heat transfer via a plurality of heat exchanger fins 34 which can be incorporated with a component enclosure 36.

To further improve the heat transfer capability for the heat producing components of circuit board assembly 10, a conductive thermal transfer device 38 such as a heatframe 40 can be connected to mounting plate/cover 22. Heatframe 40 is in proximity to and provides additional conductive heat transfer paths for all of the heat generating components of circuit board assembly 10, including CPU 28.

When CPU 28 is provided as a commercial grade device, CPU 28 may have startup limitations or may not be able to start when CPU 28 and/or the other components of circuit board assembly 10 are at a temperature ranging from zero ° C. down to a temperature of approximately (minus)-45° C. For this operating temperature range, herein collectively defined as a cold startup condition, a temperature of the thermal transfer device 38 or the CPU 28 can individually range between approximately zero ° C. to −45° C. Because CPU 28 may not be able to start during the cold startup condition, a heating device 42 is provided with circuit board assembly 10 to pre-heat CPU 28 to a temperature above zero ° C. According to several embodiments, heating device 42 is a resistance wire element heater rated at approximately 15 watts at 5 volts and 3 Amps input. According to several embodiments, heating device 42 can be an elastically flexible polyimide heater produced by Minco Corporation of Minneapolis, Minn. For maximizing heat transfer, heating device 42 is fixed in a heatframe slot 44 using a fixing agent 46 such as a thermally conductive or non-thermally conductive adhesive.

Heater terminals 48 of heating device 42 are connected to a heater control circuit 50 provided with printed circuit board 24. On-off cycling and the time intervals of on and/or off operation of heating device 42 are controlled using heater control circuit 50 with power provided from a power circuit (not shown in this view).

Figure 3:
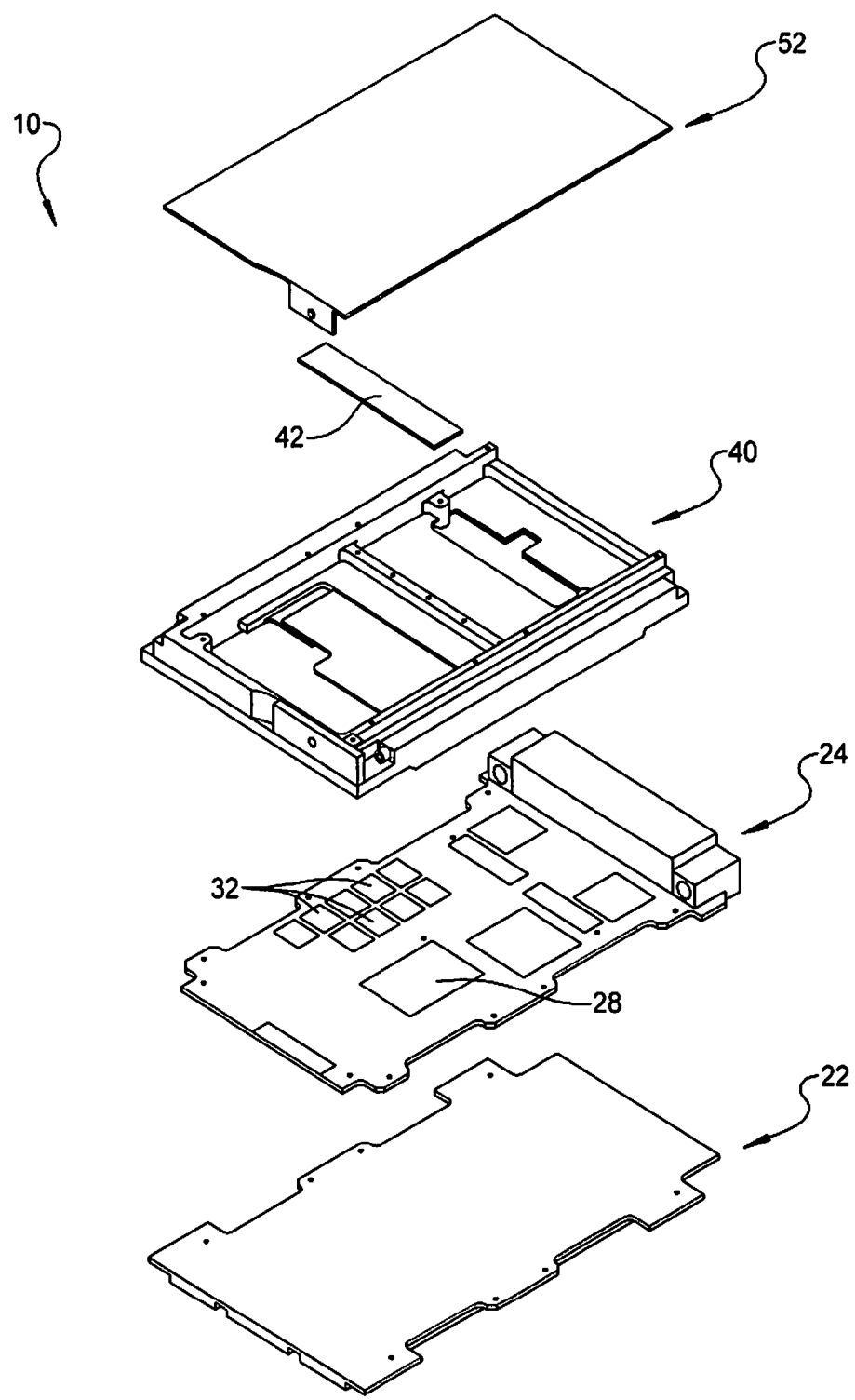
FIG. 3 is an exploded assembly view of the circuit board assembly of FIG. 2.

Referring to FIG. 3, circuit board assembly 10 is assembled as follows. The printed circuit board 24 is connected to the mounting plate/cover 22 for example by fastening. In the embodiments shown, the CPU 28 and memory devices 32 face oppositely away from the mounting plate/cover 22. The thermal transfer device, which in the embodiment shown is heat frame 40, is connected to both the printed circuit board 24 and the mounting plate/cover 22 for example by fastening. The heating device 42 is connected to the heat frame 40 and electrically connected to the printed circuit board 24 such that heat energy from the heating device 42 when energized is conductively distributed through the heat frame 40. A second cover 52 can then be connected to the heat frame 40.

Referring to FIG. 4 and again to FIG. 2, components connected to an upper/first side 54 of printed circuit board 24 include CPU 28, the memory devices 32, a MOSFET 56 which can be connected to the heater control circuit 50, and a PCH 58. The printed circuit board 24 of circuit board assembly 10 can further include a first temperature monitoring device 60 such as an inlet thermal sensor operating to sense a temperature $T_1$ of the thermal transfer device 38. The printed circuit board 24 of circuit board assembly 10 can further include a second temperature monitoring device 62 such as an inlet thermal sensor which senses a temperature $T_2$ of the CPU 28.

Figure 4:
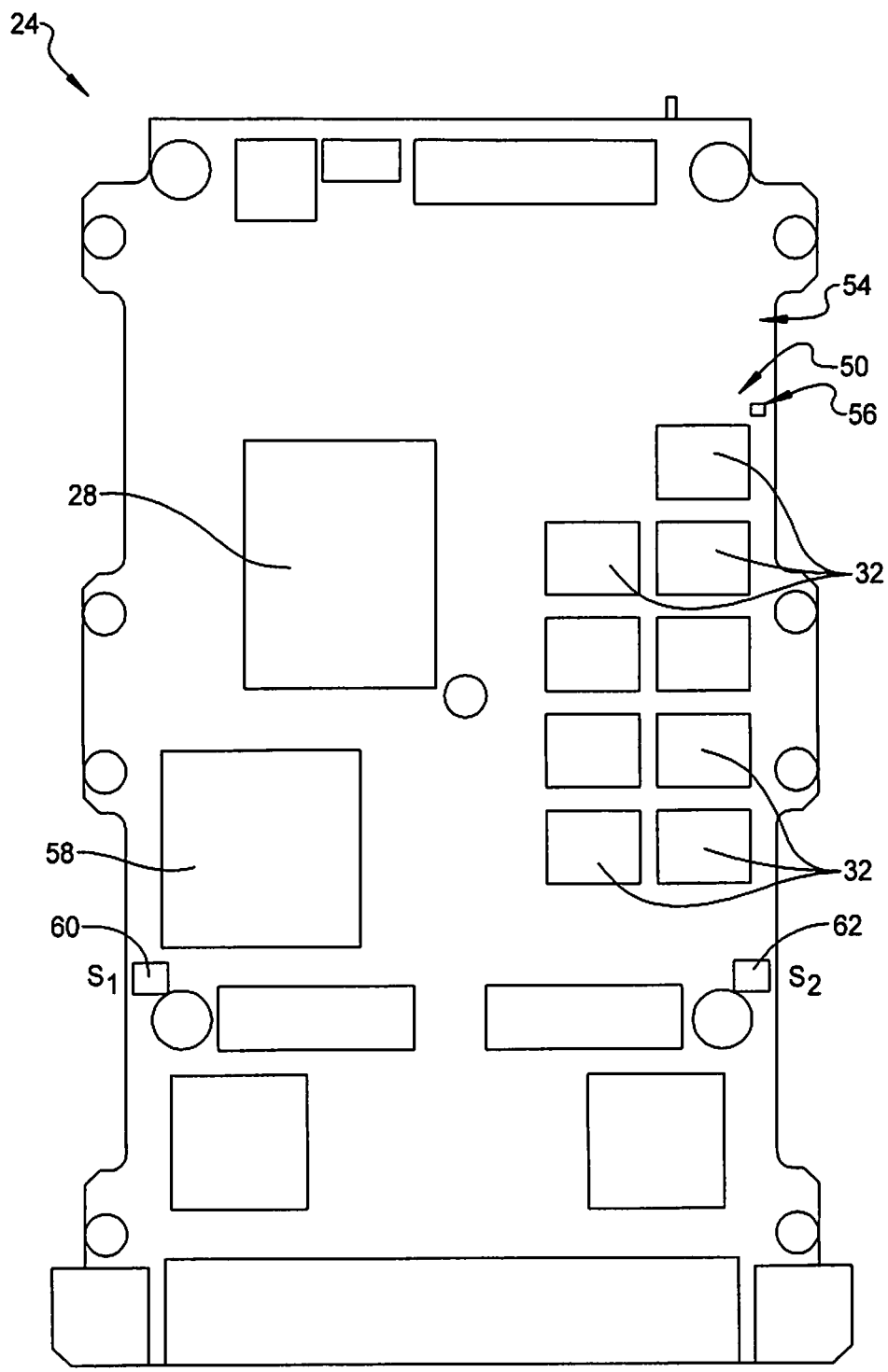
FIG. 4 is a top plan view of the circuit board assembly of FIG. 2.
Figure 5:
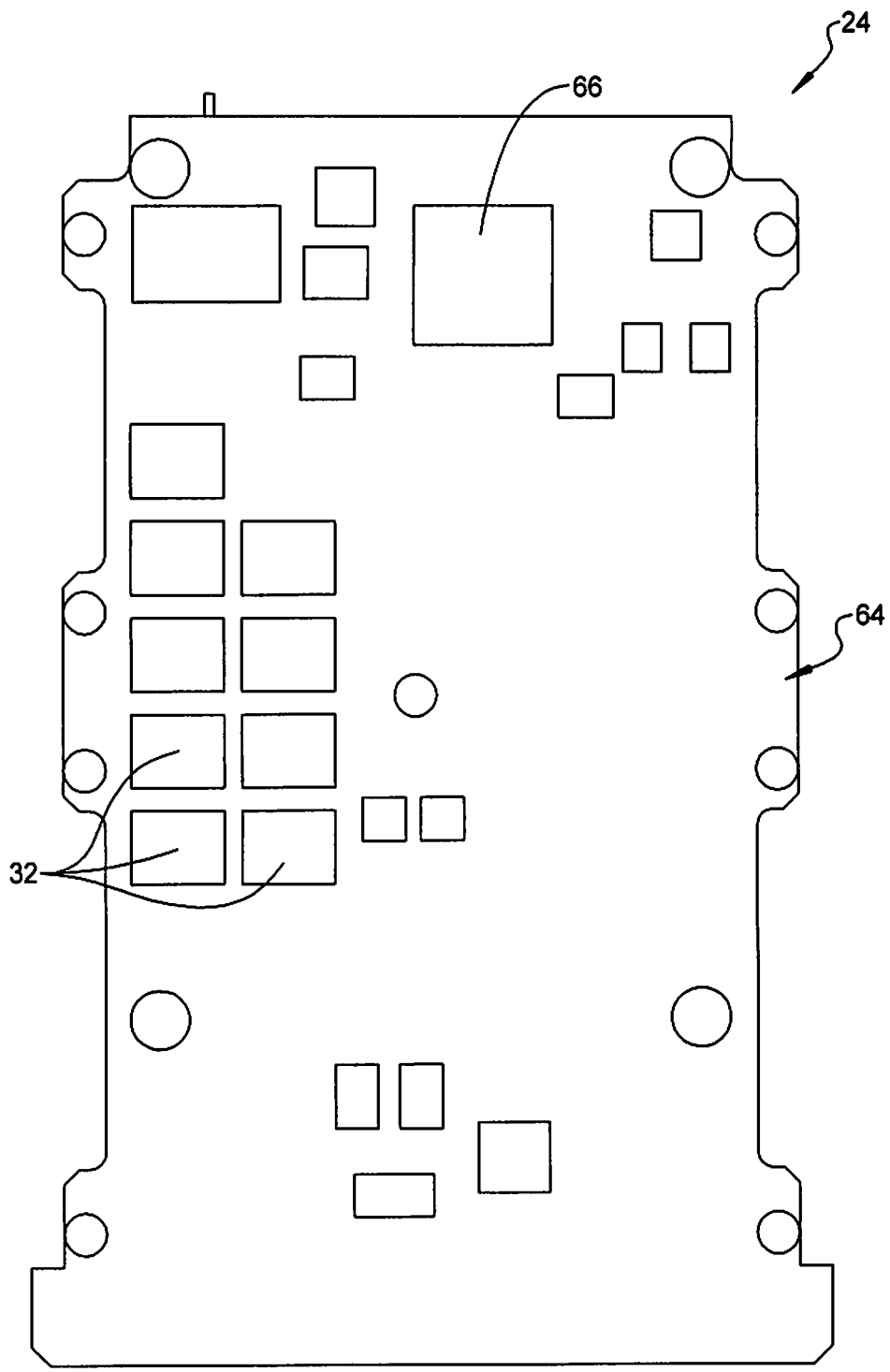
FIG. 5 is a bottom plan view of the circuit board assembly of FIG. 2.

Referring to FIG. 5 and again to FIGS. 2 and 4, components connected to a lower/second side 64 of printed circuit board 24 include additional memory devices 32 and a field programmable gate array (FPGA) 66. FPGA 66 acts as the main thermal management controller. FPGA 66 controls both "ON" (energized) and "OFF" (de-energized) times of heating device 42. For automatic temperature control function, the FPGA 66 receives temperature indications T1, T2 from the first and second temperature monitoring devices 60, 62 as well as a temperature from CPU 28 and energizes the heating device 42 when a temperature indicative of the cold startup condition is present. FPGA 66 automatically de-energizes heating device 42 after a first predetermined period of time (for example approximately 4 minutes), maintains the heating device 42 in the de-energized state for a second predetermined period of time (for example approximately 1 minute), re-analyzes the temperature indications T1, T2 from the first and second temperature monitoring devices 60, 62 as well as from CPU 28, and identifies if further operation of heating device 42 is required. These steps are repeated as necessary until temperature indications T1, T2 from the first and second temperature monitoring devices 60, 62 and from CPU 28 indicate the temperature indicative of the cold startup condition is no longer present. Heating device 42 is controlled by the FPGA 66 via the MOSFET 56 and heater control circuit 50.

The central processing unit (CPU) 28 is mounted to the circuit board assembly 10. The thermal transfer device 38 is connected to the circuit board assembly 10 and normally acts when the CPU 28 is operating at a temperature greater than the temperature of the cold startup condition to remove heat generated by the CPU 28. The heating device 42 is connected to or can be fixed to the thermal transfer device 38. The heating device 42 is energized when a temperature at the thermal transfer device 38 and/or the CPU 28 defining the cold startup condition is sensed. The heating device 42 induces heat energy input into the thermal transfer device 38 to heat the thermal transfer device 38 and thereby the CPU 28, and/or any of the other computer components 26, to a temperature above the temperature of the cold startup condition.

Figure 6:
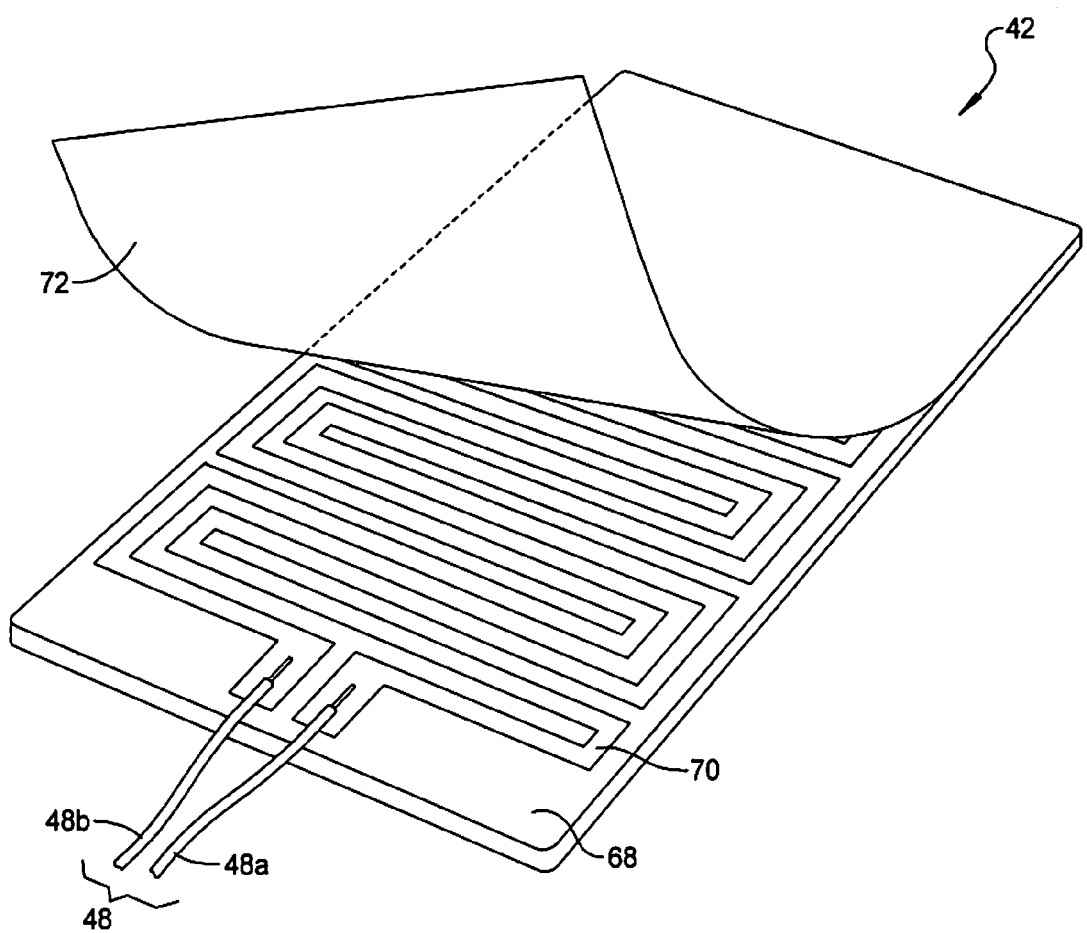
FIG. 6 is a top left perspective view of a heating device of the present enclosure.

Referring to FIG. 6 and again to FIG. 2, heating device 42 can be both longitudinally and laterally flexible (elastically bendable) to allow heating device 42 to be accurately positioned and conform to the surface geometry of heatframe slot 44. Heating device 42 according to several embodiments includes an etched base 68 having a resistive element 70 created thereon. Individual heater terminals 48a, 48b are connected to opposed ends of the resistive element 70. According to several embodiments, heating device 42 is rated at 3 amperes, but can vary according to the size of heatframe 40 and printed circuit board 24. A flexible insulation layer 72 can be applied over etched base 68 which electrically isolates and protects resistive element 70, and which provides a smooth surface area fixed, using fixing agent 46, to heatframe slot 44.

Figure 7:
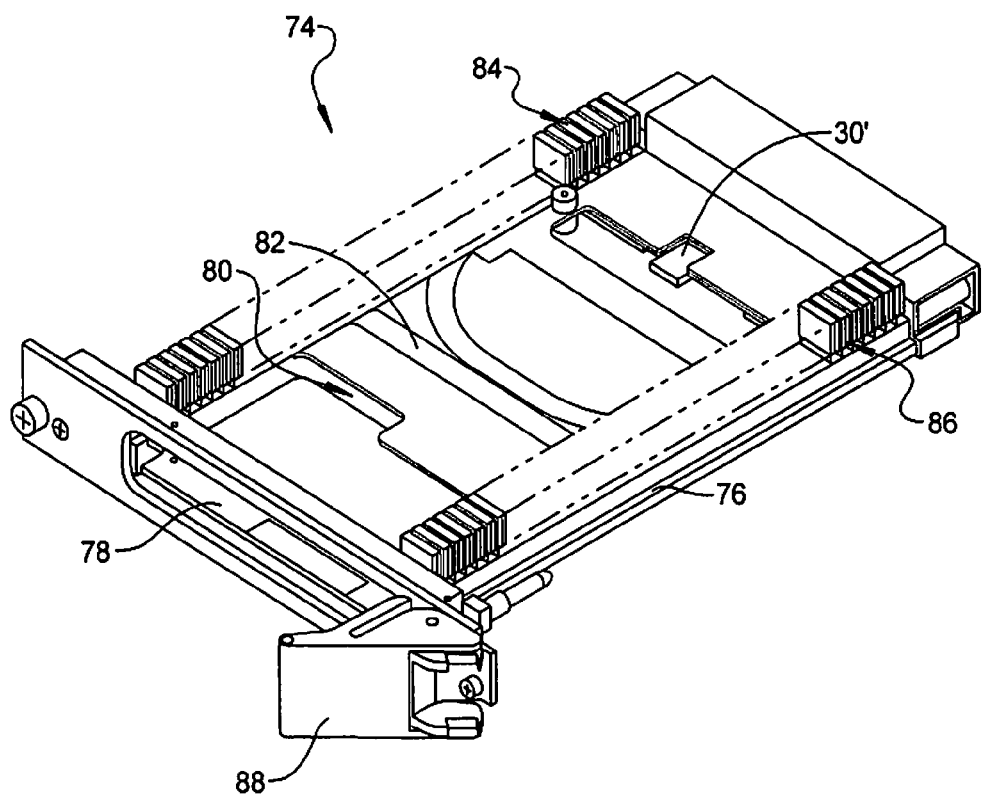
FIG. 7 is a top left perspective view of a convectively heated/cooled circuit board assembly of the present enclosure.

Referring to FIG. 7 and again to FIG. 2, according to additional embodiments a circuit board assembly 74 differs from circuit board assembly 10 by acting as a predominantly convectively heated/cooled assembly. Circuit board assembly 74 includes a mounting plate/cover 76 to which a printed circuit board 78 is connected for example by fastening. Mounting plate/cover 76 can further include a heating device slot 80 to which is fixed a heating device 82 which is similar in design and operation to heating device 42. When energized, heating device 82 heats mounting plate/cover 76 and first and second heatsinks 84, 86 which are connected to mounting plate/cover 76. Components of printed circuit board 78, which are similar to the components of printed circuit board 24, can be similarly heated during a cold startup condition, or cooled by convective heat transfer through first and second heatsinks 84, 86 when heating device 82 is de-energized during the operational mode of circuit board assembly 74. With continuing reference to FIGS. 7, 1 and 2, circuit board assembly 74, as well as circuit board assembly 10 can further include a release/latching device 88 which can be used to releasably connect the circuit board assemblies 10, 74 to cabinet 12.

Figure 8:
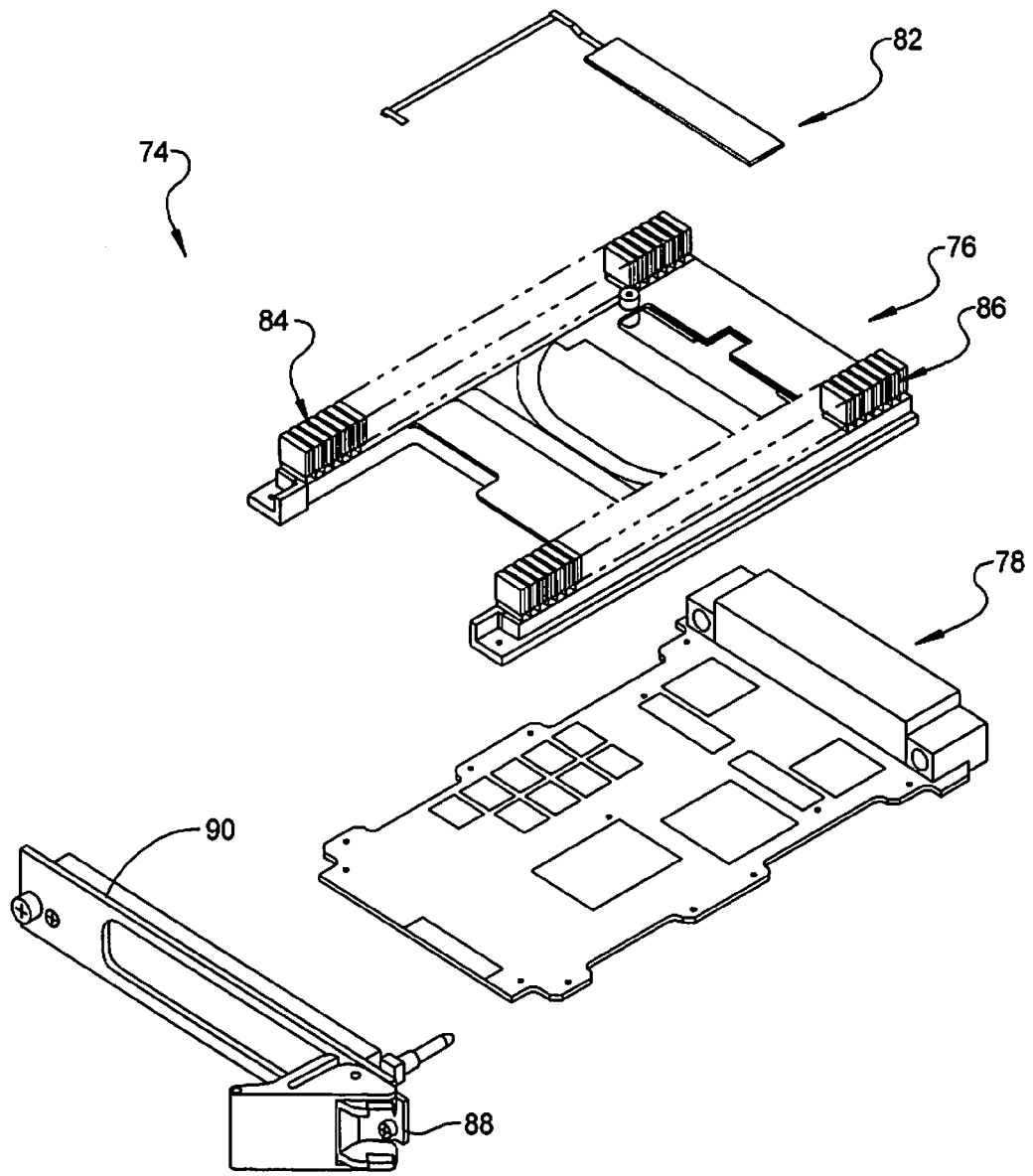
FIG. 8 is an exploded view of the convectively heated/cooled circuit board assembly of FIG. 7.

Referring to FIG. 8, the components of circuit board assembly 74 are shown prior to assembly. First and second heatsinks 84, 86 are connected to mounting plate/cover 76. The release/latching device 88 is provided with an end plate assembly 90 which is connected to mounting plate/cover 76. The heating device 82 can be connected to mounting plate/cover 76 prior to mounting mounting plate/cover 76 to circuit board 78, and then electrically connected to circuit board 78.

Figure 9A:
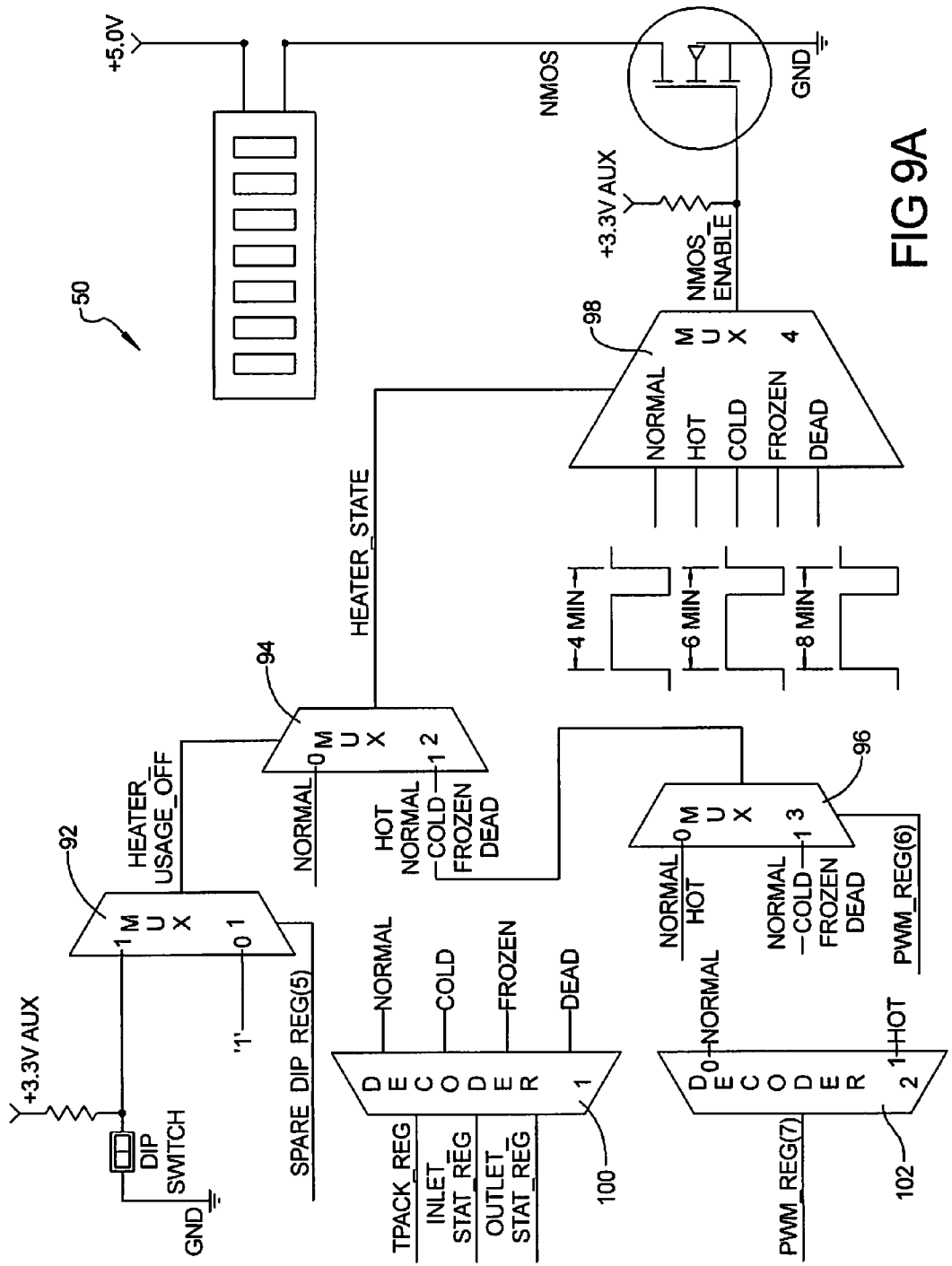
FIG. 9A is a first portion of a circuit diagram of the heater control system of the present disclosure.
Figure 9B:
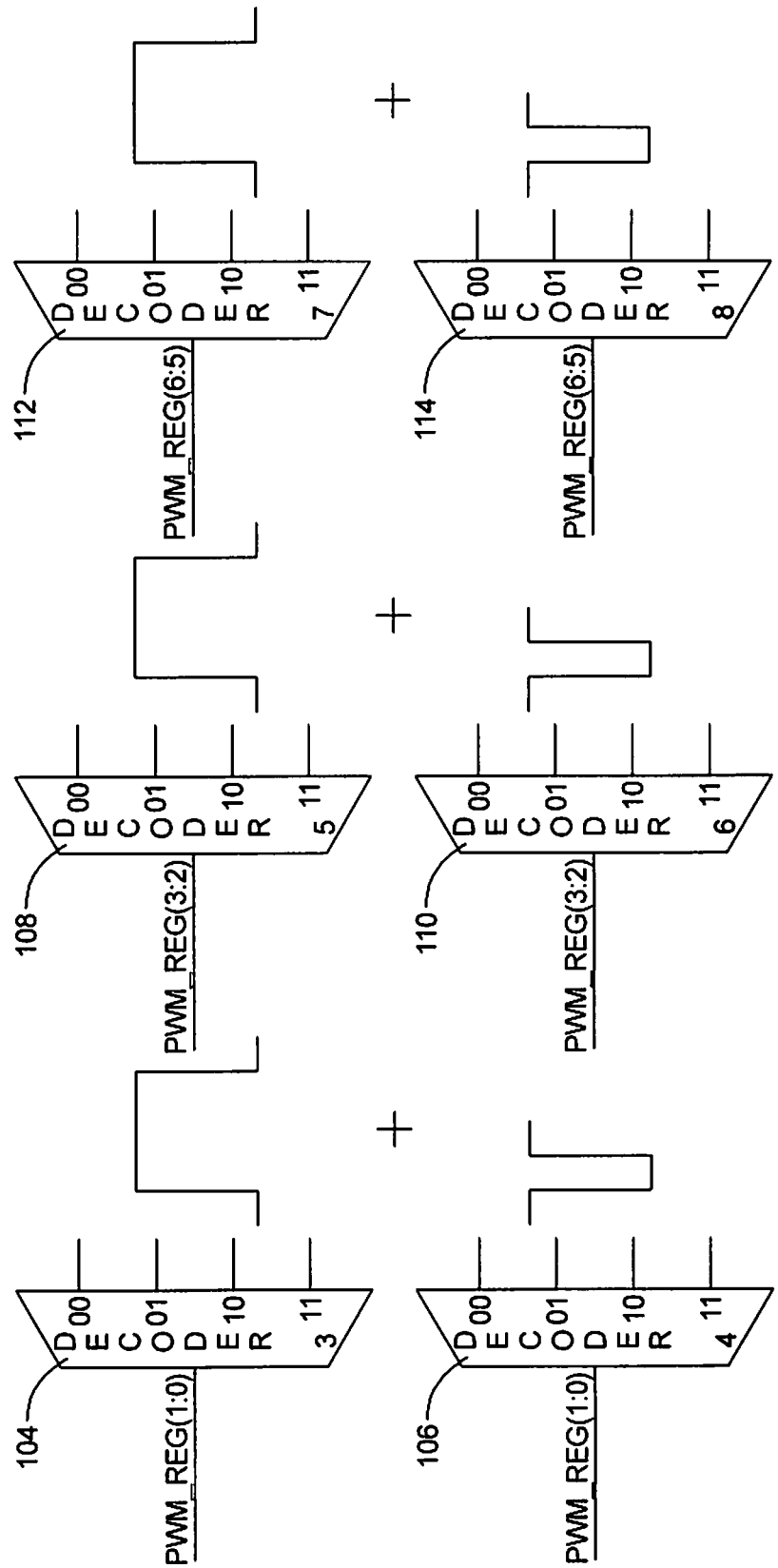
FIG. 9B is a second portion of the circuit diagram of the heater control system of the present disclosure.

Referring to FIGS. 9 and 9B, and with continuing reference to FIGS. 2-5, components of the heater control circuit 50 can include dip switch 30, first, second, third and fourth mulitplexers 92, 94, 96 and 98, and first, second, third, fourth, fifth, sixth, seventh and eighth decoders 102, 104, 106, 108, 110, 112, and 114. First multiplexer 92 enables control of the heating device 42, 82 via dip switch 30, 30'. The dip switch 30, 30' can manually turn on/off the heating device 42, 82 with the heating device 42, 82 configured via FPGA register SPARE_DIP_REG (5). If register SPARE_DIP_REG (5) is asserted, usage of the heater device 42, 82 depends on the status of the dip switch 30, 30'. If register SPARE_DIP_REG (5) is not asserted heating device 42, 82 is always enabled.

First decoder 100 acts as a temperature state decoder. The temperature states are decoded via values of any the following FPGA registers: 1) CPU package temperature (TPACK_REG); 2) Inlet temp sensor status (INLET_STAT_REG); or 3) Outlet temp sensor status (OUTLET_STAT_REG).

The following temperature states are provided for decoder 100. 1) NORMAL: a) The CPU 28 package temperature is above 20° C. (a limit is configurable from 20° C. up to 34° C.); or b) a circuit board 24, 78 inlet temperature sensor reading is above −10° C.; or c) a circuit board 24, 78 outlet temperature sensor reading is above −10° C.; 2) COLD: a) the CPU 28 package temperature is below 20° C.; or b) the circuit board 24, 78 inlet temp sensor reading is below −10° C.; or c) the circuit board 24, 78 outlet temp sensor reading is below −10° C.; 3) FROZEN: a) the CPU 28 package temperature is below 15° C. (limit is configurable from 15° C.° C. up to 22° C.); or b) the circuit board 24, 78 inlet temperature sensor reading is below −15° C.; or c) the circuit board 24, 78 outlet temp sensor reading is below −15° C.; 4) DEAD: a) the CPU 28 package temperature is below 0° C. (limit is configurable from 0° C. to 7° C.); b) the circuit board 24, 78 inlet temp sensor reading is below −45° C.; or c) the circuit board 24, 78 outlet temp sensor reading is below −45° C.

Second decoder 102 provides for heating device manual control state. The states are decoded via a value of the following FPGA register: PWM Control (PWM_REG) (7). The states of decoder 102 are a) NORMAL: the heating device 42, 82 is manually OFF; or b) HOT: the heating device 42, 82 is manually ON.

Multiplexer 92 acts as a temperature state selector. If the 'heater_usage_off' signal is '0', the heating device status could only be in the NORMAL state. At the NORMAL state, the heating device is shut OFF. Otherwise, if the 'heater_usage_off' signal is '1', the heating device status could either be in the NORMAL, HOT, COLD, FROZEN or DEAD state.

Multiplexer 94 acts as a thermal management enabler. The thermal management functionality at negative temperature can be disabled/enabled through the following register: PWM control (PWM_REG) bit 6. If the PWM_REG (6) is asserted, the thermal management is enabled, thus the heating device could be in either the NORMAL, COLD, FROZEN or DEAD state. Otherwise, if the PWM_REG (6) is not asserted, thermal management is disabled and the heating device could only be in the NORMAL or HOT state.

Third decoder 104 acts as a COLD state heating device positive enable pulse width decoder. At the COLD state, the heating device would be turned ON/OFF once every 4 minutes. The ON time is configured via register PWM Control (PWM_REG) bits [1:0]. At a) PWM_REG(1:0)="00", ON time is 239904 ms (3.9984 min); b) PWM_REG(1:0)="01", ON time is 239936 ms (3.99893 min); c) PWM_REG (1:0)="10", ON time is 239968 ms (3.999467 min); and d) PWM_REG(1:0)="11", ON time is 240000 ms (4.0 min, Always ON).

Fourth decoder 106 acts as a COLD state heating device enable negative pulse width decoder. At the COLD state, the heating device's OFF time is configured via register PWM Control (PWM_REG) bits [1:0]. At a) PWM_REG (1:0)="00", OFF time is 96 ms; b) PWM_REG(1:0)="01", OFF time is 64 ms; c) PWM_REG(1:0)="10", OFF time is 32 ms; and d) PWM_REG(1:0)="11", OFF time is 0 ms, Always ON.

Fifth decoder 108 acts as a FROZEN state heating device enable positive pulse width decoder. At the FROZEN state, the heating device would be turned ON/OFF once every 6 minutes. The ON time is configured via register PWM Control (PWM_REG) bits [3:2]. At a) PWM_REG(3:2)="00", ON time is 359904 ms (5.9984 min); b) PWM_REG (3:2)="01", ON time is 359936 ms (5.99893 min); c) PWM_REG(3:2)="10", ON time is 359968 ms (5.999467 min); and d) PWM_REG(3:2)="11", ON time is 360000 ms (6.0 min, Always ON).

Sixth decoder 110 acts as a FROZEN state heating device enable negative pulse width decoder. At the FROZEN state, the heating device's OFF time is configured via register PWM Control (PWM_REG) bits [3:2]. At a) PWM_REG (3:2)="00", OFF time is 96 ms; b) PWM_REG(3:2)="01", OFF time is 64 ms; c) PWM_REG(3:2)="10", OFF time is 32 ms; and d) PWM_REG (3:2)="11", OFF time is 0 ms, (Always ON).

Seventh decoder 112 acts as a DEAD state heating device enable positive pulse width decoder. At the DEAD state, the heating device would be turned ON/OFF once every 8 minutes. The ON time is configured via register PWM Control (PWM_REG) bits [5:4]. At a) PWM_REG(5:4)="00", ON time is 479904 ms (7.9984 min); b) PWM_REG(5:4)="01", ON time is 479936 ms (7.99893 min); c) PWM_REG (5:4)="10", ON time is 479968 ms (7.999467 min); and d) PWM_REG(5:4)="11", ON time is 470000 ms (8.0 min, Always ON).

Eighth decoder 114 acts as a DEAD state heating device enable negative pulse width decoder. At the DEAD state, the heating devices' OFF time is configured via register PWM Control (PWM_REG) bits [5:4]. At a) PWM_REG (5:4)="00", OFF time is 96 ms; b) PWM_REG(5:4)="01", OFF time is 64 ms; c) PWM_REG(5:4)="10", OFF time is 32 ms; and d) PWM_REG(5:4)="11", OFF time is 0 ms, (Always ON).

Multiplexer 98 acts as a heating device enable pattern multiplexer. At the NORMAL state, the heating device is turned OFF. At the HOT state, the heating device is turned ON. At the COLD state, the heating device is turned ON/OFF once every 4 minutes. At the FROZEN state, the heating device is turned ON/OFF once every 6 minutes. At the DEAD state, the heating device is turned ON/OFF once every 8 minutes.

There are two options to manually turn ON/OFF the heating devices. These first or Option 1 acts through the DIP switch 30. This is accomplished as follows: a) Enable usage of the DIP switch by configuring the value of SPARE_DIP_REG(7:0) register to "00100000"; or b) disable the thermal management function by configuring the value of PWM_REG bit 6 to '0'. The heating device is ON when the DIP switch 30 is OFF. The heating device is OFF when the DIP switch 30 is ON. The second option or Option 2 is through Register Access. This is accomplished as follows: a) disable the thermal management function by configuring the value of PWM_REG bit 6 to '0'; or b) Switch OFF the heating device by writing a '0' on PWM_REG bit 7.

As noted herein, the cold startup condition can include ambient and/or component temperatures ranging between approximately zero ° C. to −45° C. It is noted that operation of the heating devices of the circuit board assemblies of the present disclosure can be continuous or intermittent when components of the circuit board assemblies are within the above temperature range and there is indication that CPU 28 is not running. It is also noted that operation of the heating devices can occur when CPU 28 is running if the sensed temperature of any of the components of the circuit board assemblies, including CPU 28, are determined to fall within the cold startup condition temperature range of approximately zero ° C. to −45° C.

Circuit board assembly 10 can include heater control circuit 50 connected to the first and second temperature monitoring devices 60, 62 and to heater terminals 48 of the heating device 42. The heater control circuit 50 operates to energize the heating device 42 upon receipt of a temperature signal $S_1$ or $S_2$ from at least one of the first or second temperature monitoring devices 60, 62 representative of the cold startup condition. As noted herein, the cold startup condition is defined as a temperature of either the thermal transfer device 38 or the CPU 28 between approximately zero ° C. to −45° C. It is anticipated that following a prolonged shutdown of the circuit board assembly 10, both the thermal transfer device 38 and the CPU 28 should be at the same temperature, corresponding to an ambient atmospheric temperature. It is also anticipated that during operation of the thermal transfer device 38 and the CPU 28 that temperature differences between the thermal transfer device 38 and the CPU 28 will occur. Under operational conditions, if the temperature of either or both of the thermal transfer device 38 and/or the CPU 28 is between approximately zero ° C. to −45° C., the heating device 42 will be energized.

With reference again to FIGS. 2 and 6, according to several embodiments, the thermal transfer device 38 is provided as heatframe 40 which can be a metal material such as aluminum to increase its heat transfer coefficient. The heating device 42 includes at least one resistive element 70 and insulation layer 72, which can be a polymeric material. The insulation layer 72 is bonded or fixed to the heatframe 32 to conduct heat energy from the resistive element 70 of heating device 42 to the heatframe 32 to increase a temperature of CPU 28 and/or any of the other computer components 26.

With reference again to FIGS. 6 and 7, according to several embodiments, the thermal transfer device is a heatsink such as first and second heatsinks 84, 86. First and second heatsinks 84, 86 can be a metal material such as aluminum or copper to maximize heat transfer. Heating device 82 is similar to heating device 42 and therefore includes at least one resistive element and an insulation layer. The insulation layer of heating device 82 is fixed to the second and second heatsinks 84, 86 to convectively transfer heat energy from the heating device 82 to the first and second heatsinks 84, 86 and thereby to increase a temperature of CPU 28.

The use of FPGA 66 and MOSFET 56 provides for several operational modes of the heating devices 42, 82. In a first operational mode, when a sensed temperature from either first or second temperature monitoring devices 60, 62 indicates any of the computer components 26 such as CPU 28, heatframe 40, or first or second heatsinks 84, 86 is equal to or less than zero ° C., FPGA 66 directs heating device 42 or 82 to energize. Heating device 42 or 82 will remain energized (ON) for a first predetermined time period (approximately 4 minutes) and is then de-energized (OFF) for a second predetermined time period (approximately 1 minute), the two time periods together defining an ON/OFF cycle. The temperature of the system components and/or heatframe 40 or first and second heatsinks 84, 86 is then identified, and if all are greater than zero ° C., operation of the heating devices 42, 82 is terminated. If any of the sensed temperatures of any of the system components and/or heatframe 40 and/or first and second heatsinks 84, 86 is equal to or below zero ° C., another first mode ON/OFF cycle of the heating device 42 or 82 is initiated followed again by component temperature identification.

In a second operational mode, the heating devices 42, 82 are energized similar to the first operational mode when sensed temperature from either first or second temperature monitoring devices 60, 62 or the CPU 28 temperature indicates any of the computer components 26, heatframe 40, or first or second heatsinks 84, 86 is within a range between (minus)−45° C. and approximately −15° C. This operation is repeated in one or more ON/OFF cycles until the sensed temperature of both first and second temperature monitoring devices 60, 62 and the temperature of CPU 28 is between approximately −15° C. and zero ° C. For sensed temperatures between approximately −15° C. and zero ° C., heating devices 42, 82 are energized for a shorter third predetermined time period of approximately 1 to 2 minutes, and then de-energized for a longer fourth time period of approximately 2 to 4 minutes for each ON/OFF cycle.

Again, once the indicated first and second thermal sensor such as first and second temperature monitoring device 60, 62 temperatures, and the CPU 28 temperature are all greater than zero ° C., operation of the heating device 42 or 82 is terminated. The temperatures from first and second temperature monitoring devices 60, 62 are also periodically monitored when CPU 28 is operating to determine if a CPU 28 temperature or a temperature of any of the computer components 26 drops below zero ° C., and if so a heater operational mode is initiated. Additional operational modes are described herein with respect to heater control circuit 50 and in reference to FIG. 9.

The use of heating devices 42, 82 of the present disclosure in conjunction with thermal transfer devices such as heatframes 40 or heatsinks 84, 86 offer several advantages. By adding thermal energy directly to the heatframe or heatsink structure, the components that are normally cooled by these structures can be pre-heated or heated to permit processor start when ambient or component temperatures are at or below the minimum operating temperature of the components. Operation of the heating devices can also heat the components during component operation should their temperature drop below a predetermined minimum threshold temperature (for example, the minimum operating or startup temperature of the CPU). The heating devices of the present disclosure therefore take advantage of heat transfer paths normally used for cooling or removing excess heat from system components to permit system operation at temperatures below the minimum operating temperature of the components, thereby increasing the range of system operating conditions. By sequencing operation of the heating devices in different modes of operation, system pre-heating is optimized depending on the ambient temperature. Minimum system temperatures of −45° C. are identified herein, however operation below this temperature can also be achieved by appropriately sizing the heating device, or increasing a quantity of heating devices.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A circuit board assembly including a heating device operated during a cold startup condition, comprising:
    a printed circuit board;
    a central processing unit (CPU) mounted to the printed circuit board;
    a thermal transfer device connected to the printed circuit board acting when the CPU is operating to remove heat generated by the CPU; and
    a heating device operating to heat the thermal transfer device, the heating device energized when a temperature defining a cold startup condition of the CPU or the thermal transfer device is sensed, the heating device inducing heat energy input into the thermal transfer device to heat the thermal transfer device and the CPU to above the temperature of the cold startup condition.

2. The circuit board assembly of claim 1, further including a first temperature monitoring device operating to sense a temperature of the thermal transfer device.

3. The circuit board assembly of claim 2, further including a second temperature monitoring device operating to sense a temperature of the CPU.

4. The circuit board assembly of claim 3, further including a heater control circuit connected to the first and second temperature monitoring devices and to heater terminals of the heating device, the heater control circuit operating to energize the heating device upon receipt of a temperature signal from at least one of the first or second temperature monitoring devices representative of the cold startup condition.

5. The circuit board assembly of claim 4, wherein the thermal transfer device is a heatframe.

6. The circuit board assembly of claim 5, wherein the heating device includes at least one resistive element and an insulation layer, the insulation layer fixed to the heatframe to conduct heat energy from the heating device to the heatframe to increase a temperature of the CPU.

7. The circuit board assembly of claim 4, wherein the thermal transfer device is a heatsink.

8. The circuit board assembly of claim 7, wherein the heating device includes at least one resistive element and an insulation layer, the insulation layer fixed to the circuit board assembly to conduct heat energy from the heating device to the heatsink to increase a temperature of the CPU.

9. The circuit board assembly of claim 4, wherein the cold startup condition is defined as a temperature of either the thermal transfer device or the CPU ranging between approximately zero ° C. to −45° C.

10. The circuit board assembly of claim 4, further including a control circuit connected to the heating device individually providing first and second operational modes of the heating device, the first operational mode having the heating device energized for a first period of time and de-energized for a second period of time in repeating sequence when the temperature of either the thermal transfer device or the CPU is equal to or below approximately zero ° C., and the second operational mode having the heating device energized when the temperature of either the thermal transfer device or the CPU is equal to or below approximately zero ° C.

* * * * *